United States Patent
Bannae et al.

(10) Patent No.: US 10,809,332 B2
(45) Date of Patent: Oct. 20, 2020

(54) MAGNETIC RESONANCE IMAGING APPARATUS USING K-SPACE DATA

(71) Applicant: CANON MEDICAL SYSTEMS CORPORATION, Otawara-shi (JP)

(72) Inventors: Shuhei Bannae, Utsunomiya (JP); Satoshi Sugiura, Otawara (JP)

(73) Assignee: CANON MEDICAL SYSTEMS CORPORATION, Otawara-shi (JP)

(*) Notice: Subject to any disclaimer, the term of this patent is extended or adjusted under 35 U.S.C. 154(b) by 54 days.

(21) Appl. No.: 16/143,803

(22) Filed: Sep. 27, 2018

(65) Prior Publication Data

US 2019/0094320 A1 Mar. 28, 2019

(30) Foreign Application Priority Data

Sep. 28, 2017 (JP) ................................. 2017-188782

(51) Int. Cl.
*G01R 33/48* (2006.01)
*G06T 15/08* (2011.01)
(Continued)

(52) U.S. Cl.
CPC ..... *G01R 33/4822* (2013.01); *G01R 33/4826* (2013.01); *G01R 33/5602* (2013.01);
(Continued)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/4836; G01R 33/4838; G01R 33/50; G01R 33/543; G01R 33/5602; G01R 33/5604; G01R 33/5605; G01R 33/5607; G01R 33/5608; G01R 33/561; G01R 33/5611; G01R 33/5612; G01R 33/5613; G01R 33/5614; G01R 33/5615; G01R 33/5616; G01R 33/5617; G01R 33/5618; G01R 33/5619; G01R 33/563; G01R 33/56308; G01R 33/56316; G01R 33/56325; G01R 33/56333; G01R 33/56341; G01R 33/5635;
(Continued)

(56) References Cited

U.S. PATENT DOCUMENTS

| | | | |
|---|---|---|---|
| 2012/0153950 A1* | 6/2012 | Katscher | G01R 33/4824 324/307 |
| 2014/0100443 A1* | 4/2014 | Koktzoglou | A61B 5/7285 600/413 |
| 2017/0254867 A1* | 9/2017 | Choi | G01R 33/4818 |

OTHER PUBLICATIONS

Dana C. Peters, et al., "Undersampled Projection Reconstruction Applied to MR Angiography," Magnetic Resonance in Medicine 43, 2000, pp. 91-101.

* cited by examiner

*Primary Examiner* — Tung X Nguyen
(74) *Attorney, Agent, or Firm* — Oblon, McClelland, Maier & Neustadt, L.L.P.

(57) ABSTRACT

A magnetic resonance imaging apparatus according to an embodiment includes sequence controlling circuitry. The sequence controlling circuitry applies a pre-pulse that inverts longitudinal magnetization from a positive value to a negative value and is configured, when a predetermined time period has elapsed, to acquire k-space data by performing three-dimensional acquisitions in which a radial acquisition is performed on a kx-ky plane and a Cartesian acquisition is performed in a kz direction.

15 Claims, 8 Drawing Sheets

(51) Int. Cl.
*G01R 33/56* (2006.01)
*G01R 33/483* (2006.01)
*G01R 33/563* (2006.01)
*G01R 33/385* (2006.01)

(52) U.S. Cl.
CPC ............ *G06T 15/08* (2013.01); *G01R 33/385* (2013.01); *G01R 33/4824* (2013.01); *G01R 33/4833* (2013.01); *G01R 33/5608* (2013.01); *G01R 33/5635* (2013.01); *G06T 2211/404* (2013.01)

(58) Field of Classification Search
CPC ........ G01R 33/56358; G01R 33/56366; G01R 33/56375; G01R 33/56383; G01R 33/56391; G01R 33/565; G01R 33/56509; G01R 33/56518; G01R 33/56527; G01R 33/56536; G01R 33/56545; G01R 33/56554; G01R 33/56563; G01R 33/56572; G01R 33/56581; G01R 33/5659; G01R 33/567; G01R 33/5673; G01R 33/5676
See application file for complete search history.

FIG.2

(a) RF PULSE & DATA ACQUISITION (b) REGION OTHER THAN THE REGION TO WHICH SELECTING PULSE IS APPLIED (c) REGION TO WHICH SELECTING PULSE IS APPLIED

FIG. 7B tag-off

FIG. 7C tag-on

FIG. 7A

MAGNETIC RESONANCE IMAGING APPARATUS USING K-SPACE DATA

CROSS-REFERENCE TO RELATED APPLICATIONS

This application is based upon and claims the benefit of priority from Japanese Patent Application No. 2017-188782, filed on Sep. 28, 2017; the entire contents of which are incorporated herein by reference.

FIELD

Embodiments described herein relate generally to a magnetic resonance imaging apparatus.

BACKGROUND

As an example of Magnetic Resonance Angiography (MRA) methods by which it is possible to render blood vessels without using a contrast agent, Time Spatial Labeling Inversion Pulse (Time-SLIP) method is known. According to the Time-SLIP method, a pre-pulse (an inversion pulse) that inverts longitudinal magnetization from a positive value to a negative value is at first applied, and subsequently, a data acquisition is performed near a null point at which the longitudinal magnetization of a background tissue becomes substantially zero. As a result, for example, it is possible to render the blood flowing into an image taking region as a signal having a high intensity and to render the blood flowing out thereof as a signal having a low intensity.

Further, as a data acquisition method, a Stack of Stars method is known. According to the Stack of Stars method, three-dimensional acquisitions are realized by performing a radial acquisition on the inside of a slice plane (on the inside of a kx-ky plane) and performing a Cartesian acquisition in the slice direction (a kz direction). The Stack of Stars method makes it possible to take images with few body-movement artifacts even while the examined subject is in a free-breathing state.

However, when the Stack of Stars method is simply used during data acquisitions implementing the Time-SLIP method, the quality of images may be degraded depending on the order in which the data acquisitions are performed.

BRIEF SUMMARY OF THE INVENTION

A magnetic resonance imaging apparatus utilizes sequence control circuitry that applies a pre-pulse that inverts longitudinal magnetization from a positive value to a negative value. The sequence control circuitry is configured such that, when a predetermined time period has elapsed, k-space data is acquired by performing three-dimensional acquisitions in which a radial acquisition is performed on a kx-ky plane, and a Cartesian acquisition is performed in a kz direction.

DETAILED DESCRIPTION

A magnetic resonance imaging apparatus according to an embodiment includes sequence control circuitry. The sequence controlling circuitry applies a pre-pulse that inverts longitudinal magnetization from a positive value to a negative value and configured, when a predetermined time period elapsed, to acquire k-space data by performing three-dimensional acquisitions in which a radial acquisition is performed on a kx-ky plane, and a Cartesian acquisition is performed in a kz direction.

First Embodiment

Figure 1:
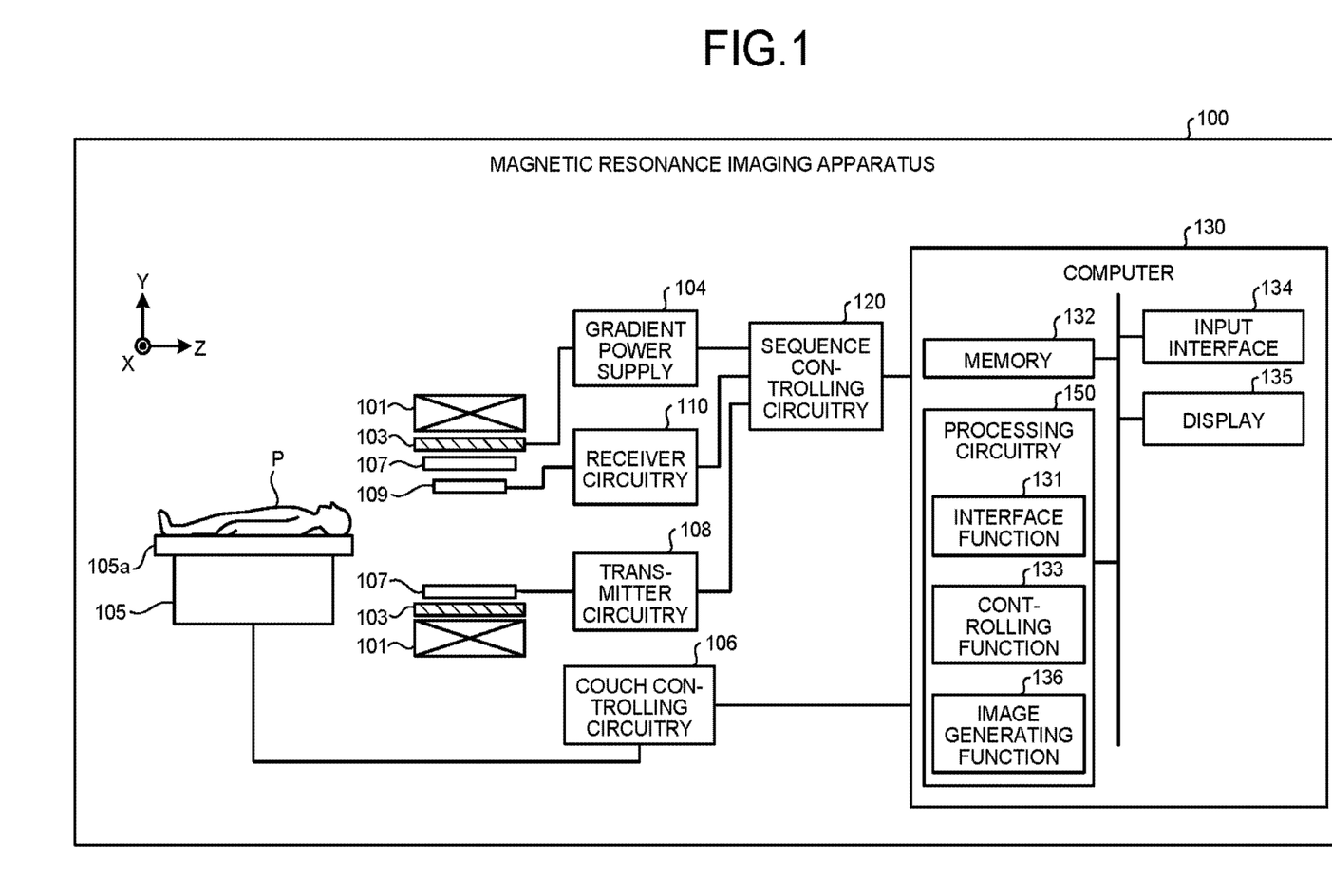
FIG. 1 is a diagram illustrating a magnetic resonance imaging apparatus according to an embodiment.

FIG. 1 is a block diagram illustrating a magnetic resonance imaging apparatus 100 according to a first embodiment. As illustrated in FIG. 1, the magnetic resonance imaging apparatus 100 includes a static magnetic field magnet 101, a static magnetic field power supply (not illustrated), a gradient coil 103, a gradient power supply 104, a couch 105, couch controlling circuitry 106, a transmitter coil 107, transmitter circuitry 108, a receiver coil 109, receiver circuitry 110, sequence controlling circuitry 120, and a computer 130 (which may also be referred to as an "image processing apparatus"). In this situation, the magnetic resonance imaging apparatus 100 does not include an examined subject (hereinafter, "patient") P (e.g., a human body). The configuration illustrated in FIG. 1 is merely an example. For instance, one or more of the constituent elements of the sequence controlling circuitry 120 and the computer 130 may be integrated together or separated from the other elements, as appropriate.

The static magnetic field magnet 101 is a magnet formed to have a hollow and substantially circular cylindrical shape and configured to generate a static magnetic field in the space on the inside thereof. For example, the static magnetic field magnet 101 may be a superconductive magnet or the like and is configured to cause magnetic excitation by receiving a supply of an electric current from the static magnetic field power supply. The static magnetic field power supply is configured to supply the electric current to the static magnetic field magnet 101. Alternatively, the static magnetic field magnet 101 may be a permanent magnet. In that situation, the magnetic resonance imaging apparatus 100 does not necessarily have to include the static magnetic field power supply. Further, the static magnetic field power supply may be provided separately from the magnetic resonance imaging apparatus 100.

The gradient coil 103 is a coil formed to have a hollow and substantially circular cylindrical shape and is disposed on the inside of the static magnetic field magnet 101. The gradient coil 103 is structured by combining together three coils corresponding to X-, Y-, and Z-axes that are orthogonal to one another. By individually receiving a supply of an electric current from the gradient power supply 104, these three coils are configured to generate gradient magnetic fields of which the magnetic field intensities change along the X-, Y-, and Z-axes, respectively. The gradient magnetic fields generated along the X-, Y-, and Z-axes by the gradient coil 103 are, for example, a slice gradient magnetic field Gs, a phase-encoding gradient magnetic field Ge, and a read-out gradient magnetic field Gr. The gradient bower supply 104 is configured to supply the electric currents to the gradient coil 103.

The couch 105 includes a couchtop 105a on which the patient P is placed. Under control of the couch controlling circuitry 106, the couchtop 105a is inserted to the inside of a hollow space (an image taking opening) of the gradient coil 103, while the patient P is placed thereon. Usually, the couch 105 is installed in such a manner that the longitudinal direction thereof extends parallel to the central axis of the static magnetic field magnet 101. Under control of the computer 130, the couch controlling circuitry 106 is configured to move the couchtop 105a in longitudinal directions and up-and-down directions by driving the couch 105. The transmitter coil 107 is disposed on the inside of the gradient coil 103 and is configured to generate a radio frequency magnetic field by receiving a supply of a Radio Frequency (RF) pulse from the transmitter circuitry 108. The transmitter circuitry 108 is configured to supply the transmitter coil 107 with the RF pulse corresponding to a Larmor frequency determined by the type of the targeted atom and intensities of magnetic fields.

The receiver coil 109 is disposed on the inside of the gradient coil 103 and is configured to receive magnetic resonance signals (which hereinafter may be referred to as "MR signals" as necessary) emitted from the patient P due to an influence of the radio frequency magnetic field. When having received the magnetic resonance signals, the receiver coil 109 outputs the received magnetic resonance signals to the receiver circuitry 110.

The transmitter coil 107 and the receiver coil 109 described above are merely examples. One or more coils may be configured by selecting one or combining two or more from among the following: a coil having only a transmitting function; a coil having only a receiving function; and a coil having transmitting and receiving functions.

The receiver circuitry 110 is configured to detect the magnetic resonance signals output from the receiver coil 109 and to generate magnetic resonance data on the basis of the detected magnetic resonance signals. More specifically, the receiver circuitry 110 generates the magnetic resonance data by performing a digital conversion on the magnetic resonance signals output from the receiver coil 109. Further, the receiver circuitry 110 is configured to transmit the generated magnetic resonance data to the sequence controlling circuitry 120. The receiver circuitry 110 may be provided on the side of a gantry device where the static magnetic field magnet 101, the gradient coil 103, and the like are provided.

The sequence controlling circuitry 120 is configured to perform an image taking process on the patient P by driving the gradient power supply 104, the transmitter circuitry 100, and the receiver circuitry 110 on the basis of sequence information transmitted thereto from the computer 130. In this situation, the sequence information is information defining a procedure for performing the image taking process. The sequence information defines: the intensity of the electric current to be supplied from the gradient power supply 104 to the gradient coil 103 and the timing with which the electric current is to be supplied; the intensity of the RF pulse to be supplied from the transmitter circuitry 108 to the transmitter coil 107 and the timing with which the RF pulse is to be applied; the timing with which the magnetic resonance signals are to be detected by the receiver circuitry 110, and the like. For example, the sequence controlling circuitry 120 may be an integrated circuit such as an Application Specific Integrated Circuit (ASIC), a Field Programmable Gate Array (FPGA) or the like or an electronic circuit such as a Central Processing Unit CPU), a Micro Processing Unit (MPU), or the like. Details of pulse sequences executed by the sequence controlling circuitry 120 will be explained later. The sequence controlling circuitry 120 is an example of the sequence controlling unit.

Further, when having received the magnetic resonance data from the receiver circuitry 110 as a result of performing the image taking process on the patient P by driving the gradient power supply 104, the transmitter circuitry 108, and the receiver circuitry 110, the sequence controlling circuitry 120 is configured to transfer the received magnetic resonance data to the computer 130.

The computer 130 is configured to exercise overall control of the magnetic resonance imaging apparatus 100 and to generate images, and the like. The computer 130 includes a memory 132, an input interface 134, a display 135, and processing circuitry 150. The processing circuitry 150 includes an interface function 131, a controlling function 133, and an image generating function 136.

In the first embodiment, processing functions performed by the interface function 131, the controlling function 133, and the image generating function 136 are stored in the memory 132 in the form of computer-executable programs. The processing circuitry 150 is a processor configured to realize the functions corresponding to the programs by reading and executing the programs from the memory 132. In other words, the processing circuitry 150 that has read the programs has the functions illustrated within the processing circuitry 150 in FIG. 1. FIG. 1 illustrates an example in which the single processing circuitry (i.e., the processing circuitry 150) realizes the processing functions performed by the interface function 131, the controlling function 133, and the images generating function 136; however, another arrangement is also acceptable in which the processing circuitry 150 is structured by combining together a plurality of independent processors, so that the functions are realized as a result of the processors executing the programs. In other words, it is acceptable to configure each of the functions described above as a program, so that the single processing circuitry (i.e., the processing circuitry 150) executes the programs. Alternatively, one or more specific functions each may be installed in a dedicated independent program-executing circuit. The controlling function 133 and the image generating function 136 are examples of the controlling unit and an image generating unit, respectively.

The term "processor" used in the above explanation denotes, for example, a Central Processing Unit (CPU), a Graphical Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). The one or more processors realize the functions by reading and executing the programs stored in the memory 132.

Further, instead of saving the programs in the memory 132, it is also acceptable to directly incorporate the programs in the circuits of the processors. In that situation, the processors realize the functions thereof by reading and executing the programs incorporated in the circuits thereof. Similarly, the couch controlling circuitry 106, the transmitter circuitry 100, the receiver circuitry 110, and the like are also each configured by using an electronic circuit such as the processor defined above.

By employing the interface function 131, the processing circuitry 150 is configured to transmit the sequence information to the sequence controlling circuitry 120 and to receive the magnetic resonance data from the sequence controlling circuitry 120. When having received the magnetic resonance data, the processing circuitry 150 including the interface function 131 is configured to store the received magnetic resonance data into the memory 132.

The magnetic resonance data stored in the memory 132 is arranged into a k-space by the controlling function 133. As a result, the memory 132 stores therein k-space data.

The memory 132 is configured to store therein the magnetic resonance data received by the processing circuitry 150 having the interface function 131; the k-space data arranged into the k-space by the processing circuitry 150 having the controlling function 133; image data generated by the processing circuitry 150 having the image generating function 136; and the like. For example, the memory 132 is configured by using a semiconductor memory element such as a Random Access Memory (RAM), a flash memory, or the like, or a hard disk, an optical disk, or the like.

The input interface 134 is configured to receive inputs of various types of instructions and information from the operator. The input interface 134 is, for example, a pointing device such as a mouse and/or a trackball; a selecting device such as a mode changing switch; and/or an input device such as a keyboard. The display 135 is configured to display, under control of the processing circuitry 150 having the controlling function 133, a Graphical User Interface (GUI) used for receiving inputs of image taking conditions, as well as images generated by the processing circuitry 150 having the image generating function 136, and the like. The display 135 is, for example, a display configured by using a liquid crystal display monitor, or the like. The display 135 is an example of a display unit.

By employing the controlling function 133, the processing circuitry 150 is configured to control image taking processes, image generating processes, image display processes, and the like, by exercising overall control of the magnetic resonance imaging apparatus 100. For example, the processing circuitry 150 having the controlling function 133 receives an input of an image taking condition (e.g., an image taking parameter or the like) via the GUI and generates sequence information according to the received image taking condition. Further, the processing circuitry 150 having the controlling function 133 transmits the generated sequence information to the sequence controlling circuitry 120.

By employing the image generating function 136, the processing circuitry 150 is configured to generate an image by reading the k-space data from the memory 132 and performing a reconstructing process such as a Fourier transform on the read k-space data.

Next, pulse sequences executed by the magnetic resonance imaging apparatus 100 according to an embodiment will be explained.

As an example of Magnetic Resonance Angiography (MRA) methods by which it possible to render blood vessels without using a contrast agent the Time Spatial Labeling Inversion Pulse (Time-SLIP) method is known. According to the Time-SLIP method, a pre-pulse (an inversion pulse) that inverts longitudinal magnetization from a positive value to a negative value is at first applied, and subsequently, a data acquisition is performed near a null point at which the longitudinal magnetization of a background tissue becomes substantially zero. As a result, it is possible to render the blood flowing into an image taking region as a signal having a high intensity and to render the blood flowing out thereof as a signal having a low intensity.

Figure 2:
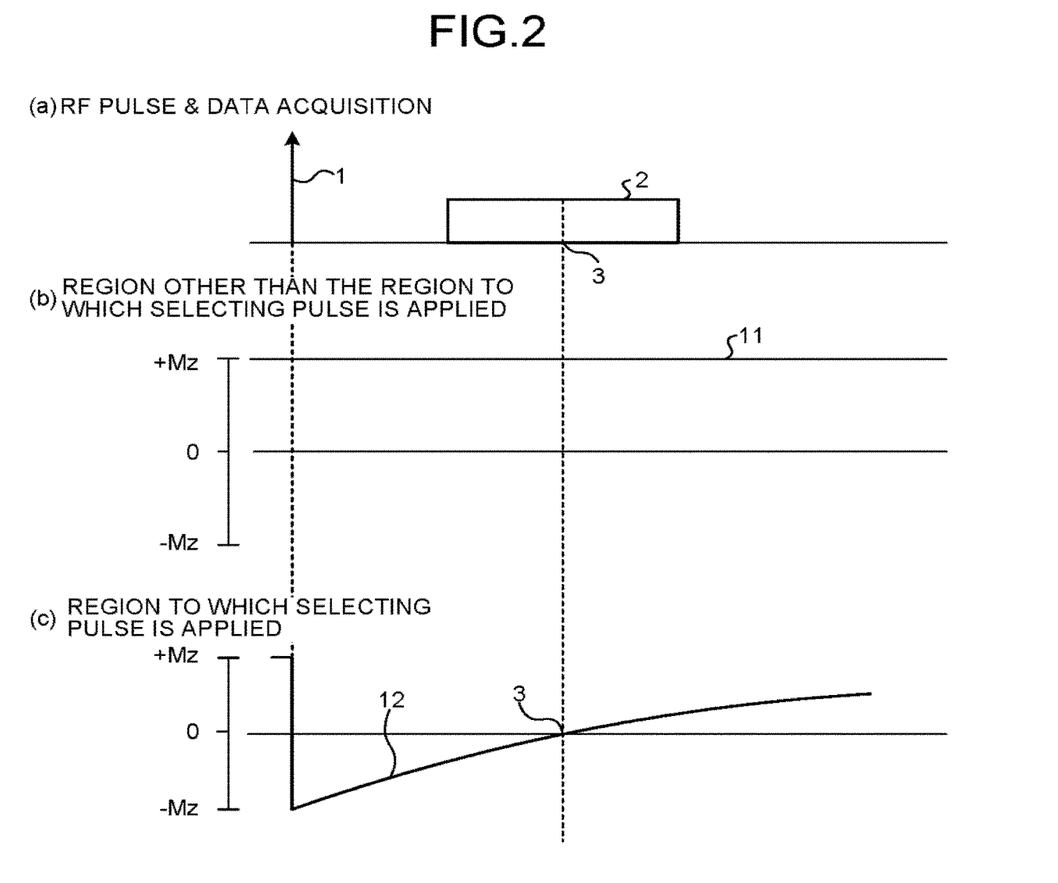
FIG. 2 illustrates an example of a pulse sequence executed by a magnetic resonance imaging apparatus according to a first embodiment.

FIG. 2 illustrates an example of a pulse sequence executed by a magnetic resonance imaging apparatus according to a first embodiment. FIG. 2 illustrates the example of the pulse sequence executed by the sequence controlling circuitry 120 according to a move-in method (a flow-in method) while implementing the Time-SLIP method. In FIGS. 2(a), 2(b), and 2(c), the horizontal axis expresses time. In FIGS. 2(b) and 2(c), the vertical axis expresses longitudinal magnetization.

According to the move-in method, the sequence controlling circuitry 120 applies a pre-pulse 1 (an inversion pulse) that inverts the longitudinal magnetization from a positive value to a negative pulse in a spatially-selective manner. For example, the sequence controlling circuitry 120 applies the pre-pulse 1 in a spatially-selective manner to a region that includes an image taking region where a data acquisition 2 is to be performed, but does not include an upstream region of the blood vessel which the operator wishes to have rendered. In one example, the sequence controlling circuitry 120 applies the pre-pulse 1 in a spatially-selective manner to a region that includes the image taking region where the data acquisition 2 is to be performed and includes an upstream region of a vein, but does not include an upstream region of an artery.

As a result of the pre-pulse 1 being applied, longitudinal magnetization 12 of the region to which the pre-pulse 1 was applied by the sequence controlling circuitry 120 is inverted from a positive value to a negative value, as illustrated in FIG. 2(c), and the longitudinal magnetization is subsequently relaxed. The signal vale of the longitudinal magnetization 12 becomes 0 at a null point 3. In contrast, as illustrated in FIG. 2(b), the value of longitudinal magnetization 11 in the region other than the region to which the pre-pulse 1 was applied by the sequence controlling circuitry 120 does not change.

Subsequently, when a predetermined time period has elapsed since the application of the pre-pulse 1, the sequence controlling circuitry 120 performs the data acquisition 2 to acquire k-space data. More specifically, the sequence controlling circuitry 120 acquires the k-space data by performing the data acquisition 2 near the null point 3 at which the longitudinal magnetization 12 of the region to which the pre-pulse 1 was applied becomes zero.

In this situation, a sin that is included in the region to which the ire-pulse 1 is applied at the time when the pre-pulse 1 is applied and that is included in the image taking region at a time near the null point 3 is rendered with a signal value zero, i.e., with a signal having a low intensity, as indicated by the longitudinal magnetization 12 in FIG. 2(c). On the contrary, a spin that is included in a region outside the region to which the pre-pulse 1 is applied at the time when the pre-pulse 1 is applied and that is included in the image taking region at a time rear the null point 3, i.e., a spin flowing into the image taking region, is rendered with a signal having a high intensity, as indicated by the longitudinal magnetization 11 in FIG. 2(b). An example will be explained in which the image taking region includes a vein and an artery, while the sequence controlling circuitry 120 applies the pre-pulse 1 in a spatially-selective manner to a region that includes the image taking region where the data acquisition 2 is to be performed and includes an upstream region of the vein, but does not include an upstream region of the artery. In that situation, a spin that is positioned in an upstream region of the artery at the time when the pre-pulse 1 is applied by the sequence controlling circuitry 120 and that is included in the image taking region at a time near the null point will be rendered with a signal having a high intensity. In contrast, other spins will be rendered with a signal having a low intensity.

During the data acquisition 2, the sequence controlling circuitry 120 acquires the k-space data by performing three-dimensional acquisitions, for example. In one example, during the data acquisition 2, the sequence controlling circuitry 120 acquires the k-space data by performing the three-dimensional acquisitions by executing a pulse sequence implementing, for example, a Fast Spin Echo (FSE) method or a balanced Steady State Free Precession (bSSFP) method.

During the data acquisition 2, while using the pulse sequence according to the FSE method or the bSSFP method, for example, the sequence controlling circuitry 120 acquires the k-space data by performing the three-dimensional acquisitions, while realizing the three-dimensional acquisitions with a Stack of Stars method by which a radial acquisition is performed on the inside of a slice plane (on the inside of the kx-ky plane), whereas a Cartesian acquisition is performed in the slice direction (the kz direction). In comparison to another method by which three-dimensional Cartesian acquisitions are performed, the Stack of Stars method has advantages where the image taking time period is relatively short, while it is possible to take images with few body-movement artifacts even while the patient is in a free-breathing state.

Figure 3:
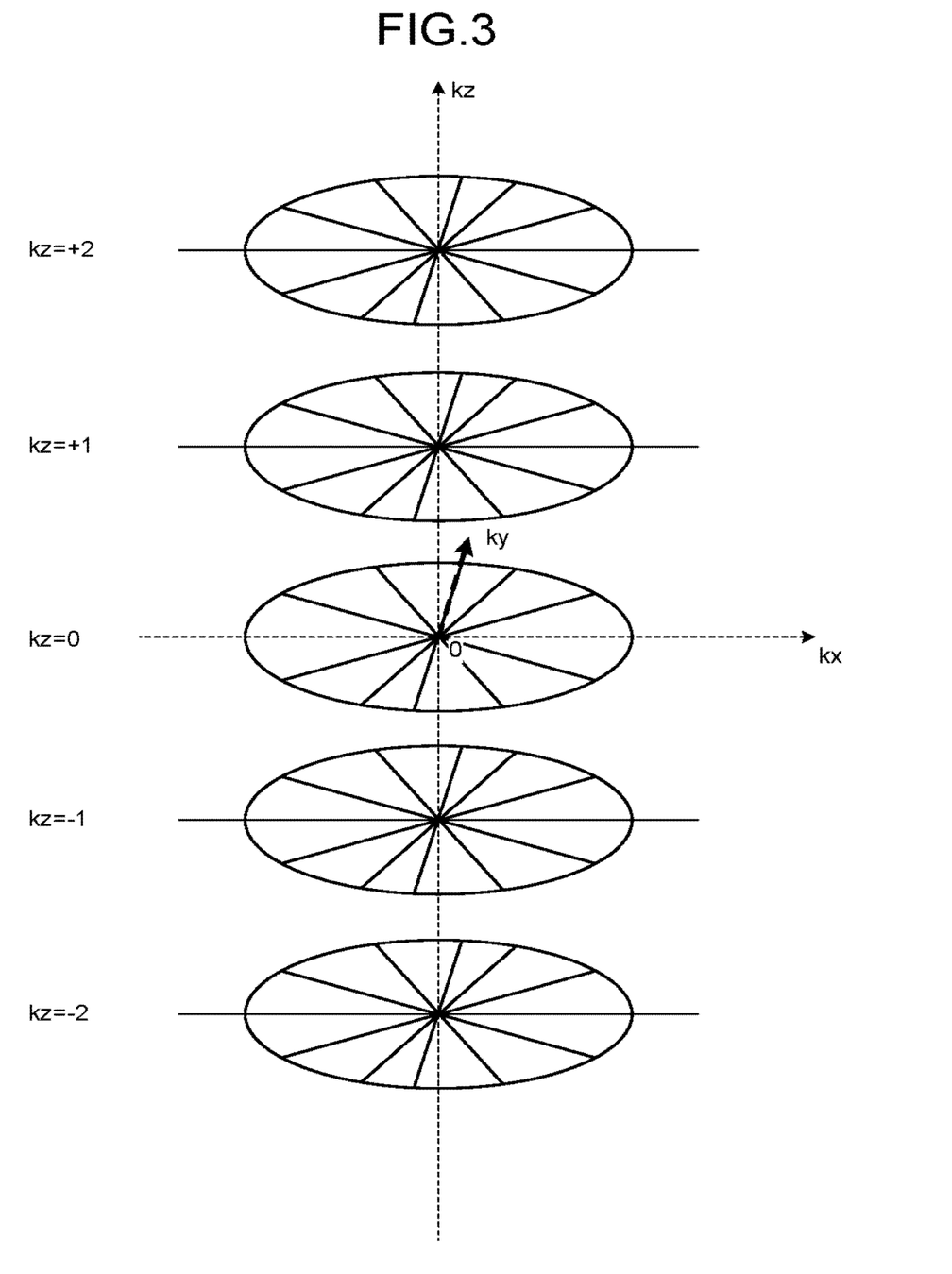
FIG. 3 is a drawing for explaining a data acquisition realized by using a Stack of Stars method.

FIG. 3 is a drawing for explaining a data acquisition realized by using the Stack of Stars method. According to the Stack of Stars method, the sequence controlling circuitry 120 performs a Cartesian acquisition in the slice direction (the kz direction). For example, the sequence controlling circuitry 120 performs data acquisitions on slices (various positions in the kz direction) such as a slice defined as kz=+2 (i.e., a two-dimensional disc-shaped kx-ky plane, which may be referred to as a slab so as to be distinguished from slices in an image space), a slice defined as kz=+1, a slice defined as kz=0, a slice defined as kz=−1, and a slice defined as kz=−2.

Further, as illustrated in FIG. 3, according to the Stack of Stars method, the sequence controlling circuitry 120 performs a radial acquisition on the inside of each of the slice planes (on the inside of the kx-ky plane). In FIG. 3, each of the straight lines radially extending from the origin of the kx-ky plane, at each of the positions in the kz direction, indicates a line from which data is acquired during the radial acquisition performed on the inside of the slice plane. For example, the sequence controlling circuitry 120 performs the data acquisition 2 with respect to any one of the lines on the kx-ky plane related to a predetermined position in the kz direction, by applying gradient magnetic fields in the x- and the y-directions while varying the values thereof and maintaining the ratio therebetween at predetermined value, while keeping the gradient magnetic field applied in the z-direction in a fixed state. By varying the gradient magnetic field applied in the z-direction, the sequence controlling circuitry 120 is able to perform the data acquisition 2 with respect to each of various positions in the kz direction. Further, by varying the value of the ratio between the gradient magnetic field in the x-direction and the gradient magnetic field in the y-direction, the sequence controlling circuitry 120 is able to perform the data acquisition 2 with respect to each of the lines in the various directions on the inside of the kx-ky plane.

Figure 4:
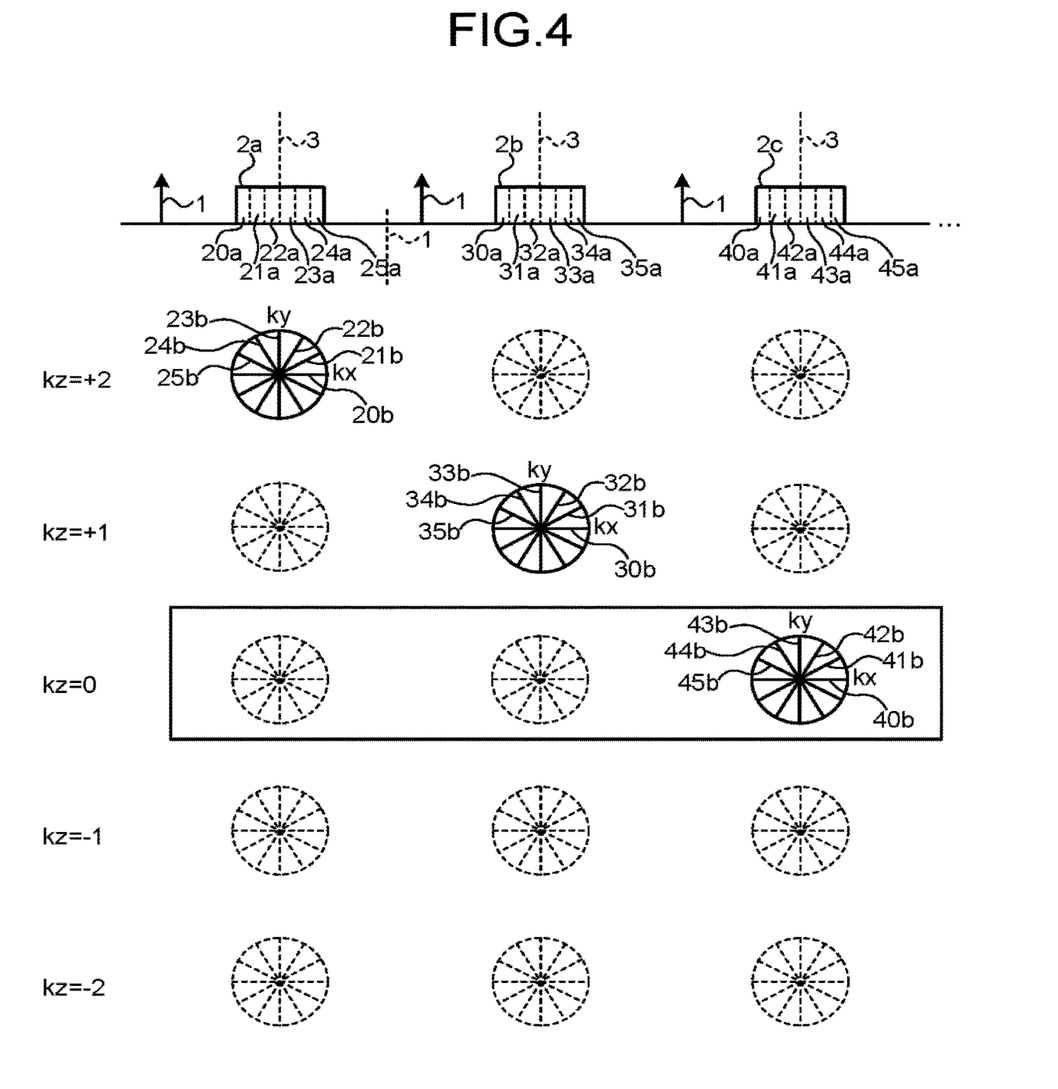
FIG. 4 is a drawing for explaining a background related to the first embodiment.

In this situation, it is important what acquisition order is used by the sequence controlling circuitry 120 for performing the three-dimensional acquisitions and acquiring the k-space data, while implementing the Stack of Stars acquisitions. This feature will be explained with reference to FIG. 4. FIG. 4 is a drawing for explaining a background of the first embodiment. With reference to FIG. 4, an example will be explained in which the sequence controlling circuitry 120 acquires k-space data by performing three-dimensional acquisitions by using a second acquisition order by which acquisitions are at first performed on the inside of the kx-ky plane and subsequently acquisitions are performed in the kz-direction. In the top section of FIG. 4, a sequence chart of a pulse sequence in the present example is illustrated, while the horizontal axis expresses time. A first acquisition order by which acquisitions are at first performed in the kz direction, and subsequently, acquisitions are performed on the inside of the kx-ky plane will be explained in detail, with reference to FIG.

As illustrated in FIG. 4, at first, the sequence controlling circuitry 120 applies the pre-pulse 1 and performs a data acquisition 2a near the null point 3. More specifically, the data acquisition 2a includes data acquisitions 20a, 21a, 22a, 23a, 24a, and 25a. The data acquisition 2a is a data acquisition of k-space lines on the inside of the kx-ky plane in the position in the kz direction defined as kz=+2. In other words, during the data acquisition 2a, the sequence controlling circuitry 120 acquires, through a radial acquisition, the plurality of k-space lines on the inside of the kx-ky plane, in the predetermined position in the kz direction. More specifically, the sequence controlling circuitry 120 acquires pieces of k-space data on k-space lines 20b, 21b, 22b, 23b, 24b, and 25b by performing the data acquisitions 20a, 21a, 22a, 23a, 24a, and 25a.

Subsequently, after applying the pre-pulse 1, the sequence controlling circuitry 120 changes the position in the kz direction near the null point 3 and performs a data acquisition 2b, which is a data acquisition on the inside of the kx-ky plane in the position in the kz direction defined as kz=+1. The sequence controlling circuitry 120 acquires pieces of k-space data on k-space lines 30b, 31b, 32b, 33b, 34b, and 35b by performing data acquisitions 30a, 31a, 32a, 33a, 34a, and 35a.

Subsequently, after applying the pre-pulse 1, the sequence controlling circuitry 120 changes the position in the kz direction near the null point and performs a data acquisition 2c, which is a data acquisition on the inside of the kx-ky plane while satisfying kz=0, i.e., near the center position in the kz direction within the k-space. The sequence controlling circuitry 120 acquires pieces of k-space data on k-space lines 40b, 41b, 42b, 43b, 44b, and 45b by performing data acquisitions 40a, 41a, 42a, 43a, 44a, and 45a.

Further, after applying the pre-pulse 1, the sequence controlling circuitry 120 changes the position in the kz-direction near the null point 3 and performs data acquisitions while satisfying kz=−1, kz=−2, and so on. In this manner, as illustrated in FIG. 4, the sequence controlling circuitry 120 acquires pieces of k-space data by using the first acquisition order by which the acquisitions are at first performed in the kz direction, and subsequently, the acquisitions are performed on the inside of the kx-ky plane.

In this situation, the k-space data that is important after the Fourier transform is the k-space data near k=0. Accordingly, when only the positions in the kz direction are considered, the data at kz=0, i.e., the data near the center position in the kz direction within the k-space is the data in the most important position in the kz direction among all the pieces of k-space data. Next, the data acquisition 2c will be discussed, which is the data acquisition performed on the inside of the kx-ky plane at kz=0. As explained above, the sequence controlling circuitry 120 performs the data acquisition 2c near the null point 3 so that the signal intensity to be suppressed is the smallest. More accurately, the sequence controlling circuitry 120 performs the data acquisition 2c in such a manner that the null point 3 falls between the data acquisition 42a and the data acquisition 43a.

Accordingly, the data acquisition 42a and the data acquisition 43a are data acquisitions in which the signals that need to be suppressed are sufficiently suppressed. However, in comparison to the data acquisition 42a and the data acquisition 43a, because the data acquisition 41a and the data acquisition 44a are each performed at a time distant from the null point 3, the signals that need to be suppressed are not sufficiently suppressed, and the quality of the data is therefore degraded. Similarly, in comparison to the data acquisition 41a and the data acquisition 44a, because the data acquisition 40a and the data acquisition 45a are each performed at a time farther distant from the null point 3, the signals that need to be suppressed are not sufficiently suppressed, and the quality of the data therefore is further degraded.

Accordingly, when the sequence controlling circuitry 120 performs the data acquisitions by using the second acquisition order by which the acquisitions are at first performed on the inside of the kx-ky plane, and subsequently, the acquisitions are performed in the kz direction, there is a possibility that the quality of the data may be degraded in some situations, because a data acquisition may be performed at a time distant from the null point 3 in certain positions near the center in the kz direction. For example, in the example illustrated in FIG. 4, in comparison to the k-space line 42b and the k-space line 43b from which the data acquisitions are each performed at a time close to the null point 3, the quality of the data acquired from the k-space line 40b and from the k-space line 45b may be degraded.

To cope with this situation, the sequence controlling circuitry 120 acquires k-space data by performing three-dimensional acquisitions while implementing the Stack of Stars method, by using the first acquisition order by which acquisitions are at first performed in the kz direction, and subsequently, acquisitions are performed on the inside of the kx-ky plane. Further, the sequence controlling circuitry 120 performs an acquisition related to a central part in the kz direction at a time when the longitudinal magnetization 12 reaches the null point 3.

Figure 5:
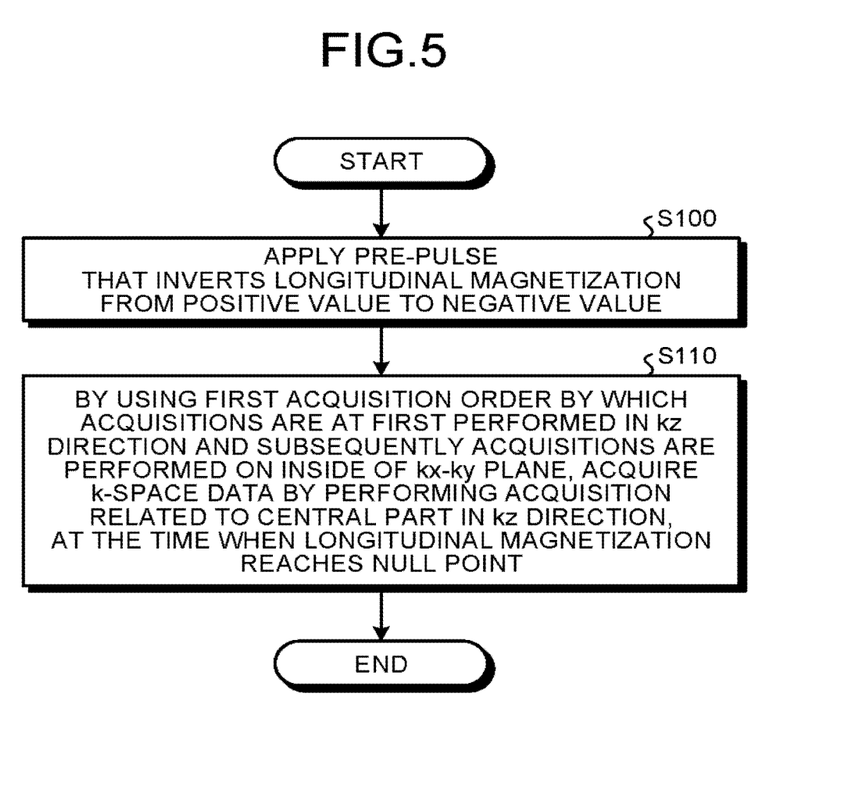
FIG. 5 is a flowchart illustrating a processing procedure performed by the magnetic resonance imaging apparatus according to the first embodiment.

This process will be explained with reference to FIGS. 5 and 6. FIG. 5 is a flowchart illustrating a processing procedure performed by the magnetic resonance imaging apparatus according to the first embodiment.

The sequence controlling circuitry 120 applies the pre-pulse 1 that inverts the longitudinal magnetization 12 from a positive value to a negative value (step S100). After a predetermined time period has elapsed, the sequence controlling circuitry 120 acquires k-space data, by performing an acquisition related to a central part in the kz direction at a time when the longitudinal magnetization reaches a null point (step S110). The sequence controlling circuitry 120 acquires the k-space data at step S110 by using the first acquisition order by which acquisitions are at first performed in the kz direction, and subsequently, acquisitions are performed on the inside of the kx-ky plane.

Figure 6:
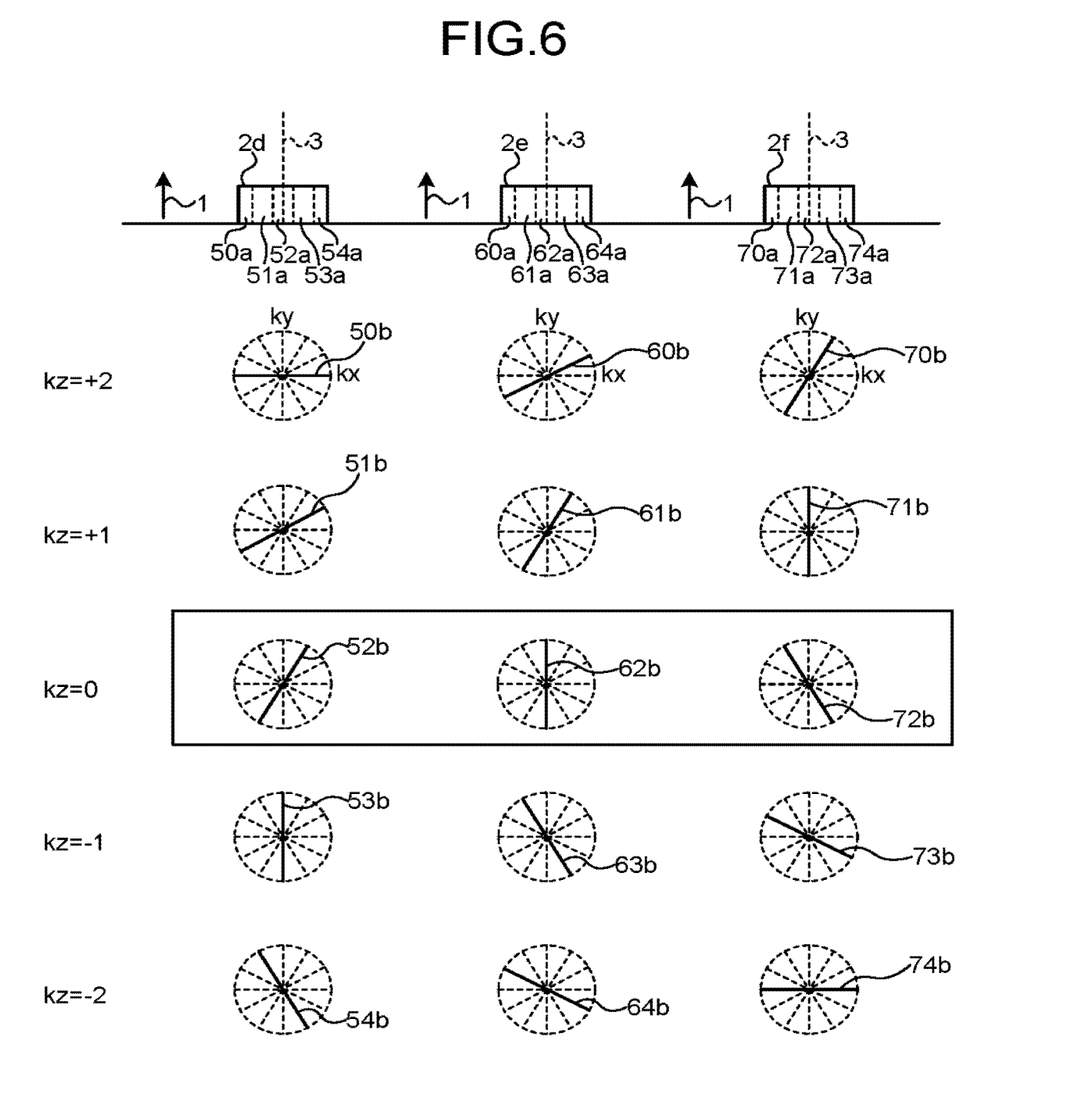
FIG. 6 is a drawing for explaining a pulse sequence executed by the magnetic resonance imaging apparatus according to the first embodiment.

This situation is illustrated in FIG. 6. FIG. 6 is a drawing for explaining a pulse sequence executed by the magnetic resonance imaging apparatus 100 according to the first embodiment. The top section of FIG. 6 illustrates the pulse sequence executed by the sequence controlling circuitry 120, while the horizontal axis expresses time.

At first, after applying the pre-pulse 1, the sequence controlling circuitry 120 performs a data acquisition 2d near the null point 3. In this situation, more specifically, the data acquisition 2d includes data acquisitions 50a, 51a, 52a, 53a, and 54a. During the data acquisition 2d, the sequence controlling circuitry 120 performs acquisitions through a radial acquisition while slightly changing the position in the kz direction and the position on the inside of the kx-ky plane. More specifically, during the data acquisition 50a, the sequence controlling circuitry 120 acquires k-space data from a k-space line 50b in the position in the kz direction expressed as kz=+2; during the data acquisition 51a, the sequence controlling circuitry 120 acquires k-space data from a k-space line 51b in the position in the kz direction expressed as k=+1; during the data acquisition 52a, the sequence controlling circuitry 120 acquires k-space data from a k-space line 52b in the position in the kz direction expressed as kz=0; during the data acquisition 53a, the sequence controlling circuitry 120 acquires k-space data from a k-space line 53b in the position in the kz direction expressed as kz=−1; and during the data acquisition 54a, the sequence controlling circuitry 120 acquires k-space data from a k-space line 54b in the position in the kz direction expressed as kz=−2.

In this situation, the sequence controlling circuitry 120 acquires the k-space data by performing the acquisition related to the central part in the kz direction at a time when the longitudinal magnetization 12 reaches the null point 3. For example, the sequence controlling circuitry 120 performs the data acquisition 52a at the time when the longitudinal magnetization 12 reaches the null point 3. As a result, the sequence controlling circuitry 120 is able to acquire the k-space data from the k-space line 52b, which is the data on the kx-ky plane expressed as kz=0 that is the central part in the kz direction, at the time when the longitudinal magnetization 12 reaches the null point 3.

Subsequently, after applying the pre-pulse 1, the sequence controlling circuitry 120 performs a data acquisition 2e near the null point 3. During data acquisitions 60a, 61a, 62a, 63a, and 64a, the sequence controlling circuitry 120 acquires pieces of k-space data from k-space lines 60b, 61b, 62b, 63b, and 64b, respectively.

The sequence controlling circuitry 120 performs the data acquisition 62a at the time when the longitudinal magnetization 12 reaches the null point 3. As a result, the sequence controlling circuitry 120 is able to acquire the k-space data from the k-space line 62b, which is the data on the kx-ky plane expressed as kz=0 that is the central part in the kz direction, at the time when the longitudinal magnetization 12 reaches the null point 3.

Subsequently, after applying the pre-pulse 1, the sequence controlling circuitry 120 performs a data acquisition 2f near the null point 3. During data acquisitions 70a, 71a, 72a, 73a, and 74a, the sequence controlling circuitry 120 acquires pieces of k-space data from k-space lines 70b, 71b, 72b, 73b, and 74b, respectively.

The sequence controlling circuitry 120 performs the data acquisition 72a at the time when the longitudinal magnetization 12 reaches the null point 3. As a result, the sequence controlling circuitry 120 is able to acquire the k-space data from the k-space line 72b, which is the data on the kx-ky plane expressed as kz=0 that is the central part in the kz direction, at the time when the longitudinal magnetization 12 reaches the null point 3.

As explained above, the sequence controlling circuitry 120 acquires the pieces of k-space data by using the first acquisition order by which the acquisitions are at first performed in the kz direction, and subsequently, the acquisitions are performed on the inside of the kx-ky plane. When the sequence controlling circuitry 120 acquires the pieces of k-space data by using the first acquisition order, the sequence controlling circuitry 120 is able to acquire the pieces of k-space data in such a manner that the acquisition related to the central part in the kz direction is performed at the time when the longitudinal magnetization 12 reaches the null point 3, by adjusting the timing of the data acquisitions. For example, the sequence controlling circuitry 120 performs the data acquisition 52a related to the k-space line 52b, the data acquisition 62a related to the k-space line 62b, and the data acquisition 72a related to the k-space line 72b each at the time when the longitudinal magnetization 12 reaches the null point 3. When FIG. 4 is compared with FIG. 6, when performing the acquisitions by using the first acquisition order, the sequence controlling circuitry 120 is able to perform each of the acquisitions at the time when the longitudinal magnetization 12 reaches the null point 3, with respect to all the lines related to the central part in the kz direction. Accordingly, the quality of the data is improved in the central part in the kz direction containing more important information among all the pieces of k-space data. It is therefore possible to realize an improvement in the image quality.

Possible embodiments are not limited to the examples described above.

In the first embodiment, the Time-SLIP method is explained with the example in which the move-in method (the flow-in method) is implemented by which only the spatially selective inversion pulse is applied; however, possible embodiments are not limited to this example.

For instance, the sequence controlling circuitry 120 may execute a pulse sequence according to a move-out method (a flow-out method). According to the move-out method, the sequence controlling circuitry 120 applies two types of pulses, namely a pre-pulse (a spatially non-selective inversion pulse) that inverts longitudinal magnetization from a positive value to a negative value in a spatially non-selective manner and a pre-pulse (a spatially selective inversion pulse) that inverts longitudinal magnetization from a positive value to a negative value in a spatially-selective manner. Subsequently, the sequence controlling circuitry 120 performs the three-dimensional acquisitions by using the first acquisition order. In that situation, the sequence controlling circuitry 120 performs the acquisition related to a central part in the kz direction at the time when the longitudinal magnetization of the region to which only the spatially non-selective inversion pulse was applied reaches a null point.

When the move-out method is used, the longitudinal magnetization of a spin that is included in the application region of the spatially selective inversion pulse at the time when the spatially selective inversion pulse is applied and that is included in the image taking region at the null point is inverted twice by the spatially non-selective inversion pulse and the spatially selective inversion pulse and is rendered as a signal having a high intensity. In contrast, as for a spin that is not included in the application region of the spatially selective inversion pulse at the time when the spatially selective inversion pulse is applied, the longitudinal magnetization thereof is inverted only by the spatially non-selective inversion pulse, and the image taking process is performed at the null point. Accordingly, such a spin is rendered as a signal having a low intensity.

In one example, when the image taking region includes an artery and a vein, the sequence controlling circuitry 120 applies the abovementioned spatially selective inversion pulse to an upstream region of the artery in the image taking region. The longitudinal magnetization of a spin that is included in the upstream region of the artery serving as the application region of the spatially selective inversion pulse at the time when the spatially selective inversion pulse is applied and that is included in the image taking region at the null point is rendered as a signal having a high intensity, while the other spins are rendered as a signal having a low intensity. As explained herein, the move-out method is usable as a functional imaging scheme from the region selected in the spatially-selective manner.

Further, in another example of the Time-SLIP sequence controlling circuitry 120 may execute put sequences according to a tag-on/tag-off difference method. In particular, the sequence controlling circuitry 120 may execute a pulse sequence related to a tag-on image and another pulse sequence related to a tag-off image by using mutually-different k-space acquisition orders. An example of this process will be explained in a second embodiment.

Further, to suppress fat signals, the sequence controlling circuitry 120 may further apply a fat suppressing pulse such as a Short-TI Inversion Recovery (STIR) pulse or a Chemical Shift Selective (CHESS) pulse.

Further, the flip angle of the pre-pulse 1 applied by the sequence controlling circuitry 120 is not limited to 180 degrees. The flip angle of the pre-pulse 1 applied by the sequence controlling circuitry 120 may be larger than 180 degrees or, conversely, may be smaller than 180 degrees.

Further, per every pre-pulse 1, the sequence controlling circuitry 120 may perform an acquisition with respect to one line on the inside of the kx-ky plane or may perform acquisitions with respect to a plurality of lines on the inside of the kx-ky plane. Further, with the application of a plurality pre-pulses 1, the sequence controlling circuitry 120 may perform an acquisition with respect to one line on the inside of the kx-ky plane. Further, in the example illustrated in FIG. 4, per every pre-pulse 1, the sequence controlling circuitry 120 may perform acquisitions in a plurality of positions in the kz direction.

Further, regarding the radial acquisition performed by the sequence controlling circuitry 120, the sequence controlling circuitry 120 may perform a high-low-high type acquisition, i.e., start the acquisition from an outer part of the k-space, go through the point corresponding to k=0, and perform acquisitions toward the outer part of the k-space. Alternatively, the sequence controlling circuitry 120 may perform a low-high type acquisition, i.e., start the acquisition from the point corresponding to k=0 and perform acquisitions toward an outer part k-space.

Further, possible forms of the first acquisition order by which the acquisitions are at first performed in the kz direction and subsequently the acquisitions are performed on the inside of the kx-ky plane include other various sequences of acquisition order besides the sequence of acquisition order illustrated in FIG. 6. For example, the sequence controlling circuitry 120 may acquire the pieces of k-space data 54b, 53b, 52b, 51b, and 50b during the data acquisitions 50a, 51a, 52a, 53a, and 54a, respectively. In another example, the sequence controlling circuitry 120 may acquire the pieces of k-space data 50b, 531o, 52b, 54b, and 51b during the data acquisitions 50a, 51a, 52a, 53a, and 54a, respectively. In yet another example, the sequence controlling circuitry 120 may acquire the pieces of k-space data 50b, 61b, 52b, 63b, and 54b during the data acquisitions 50a, 51a, 52a, 53a, and 54a, respectively.

Further, the sequence controlling circuitry 120 may at first acquisitions in the kz direction only partially and may subsequently perform the acquisitions on the inside of the kx-ky plane. For example, the sequence controlling circuitry 120 at first performs data acquisitions to acquire the pieces of k-space data 51b, 52b, and 53b or the like, so as to acquire pieces of k-space data such as the k-space data 50b and the k-space data 54b in the following pulse sequence.

Further, possible forms of the second acquisition order by which the acquisitions are at first performed on the inside of the kx-ky plane and subsequently the acquisitions are performed in the kz direction include other various sequences of acquisition order besides the sequence of acquisition order illustrated in FIG. 4. For example, the sequence controlling circuitry 120 may acquire the pieces of k-space data on k-space lines 25b, 24b, 23b, 22b, 21b, and 20b during the data acquisitions 20a, 21a, 22a, 23a, 24a, and 25a, respectively. In another example, the sequence controlling circuitry 120 may acquire the pieces of k-space data 20b, 22b, 24b, 21b, and 23b during the data acquisitions 20a, 21a, 22a, 23a, and 24a, respectively. In yet another example, the sequence controlling circuitry 120 may perform the data acquisitions related to kz=−2, kz=−1, and kz=0, during the data acquisitions 2a, 2b, and 2c, respectively.

Further, the sequence controlling circuitry 120 may combine both of the acquisition orders, namely the first acquisition order and the second acquisition order. For example, the sequence controlling circuitry 120 may perform acquisitions on a part of the k-space by using the first acquisition order and perform acquisitions on the remaining part of the k-space by using the second acquisition order.

Second Embodiment

As a second embodiment, an example will be explained with reference to FIGS. 7A, 7B, 7C and 8 in which, when the sequence controlling circuitry 120 executes the pulse sequences according to the tag-on/tag-off difference method by implementing the Time-SLIP method, the sequence controlling circuitry 120, in particular, executes a pulse sequence related to a tag-on image by using the first acquisition order by which acquisitions are at first performed in the kz direction, and subsequently, acquisitions are performed on the inside of the kx-ky plane and further executes a pulse sequence related to a tag-off image by using the second acquisition order by which acquisitions are at first performed on the inside of the kx-ky plane, and subsequently, acquisitions are performed in the kz direction.

To begin with, the pulse sequences according to the tag-on/tag-off difference method will be explained, with reference to FIGS. 7A, 7B, and 7C.

Figure 7A:
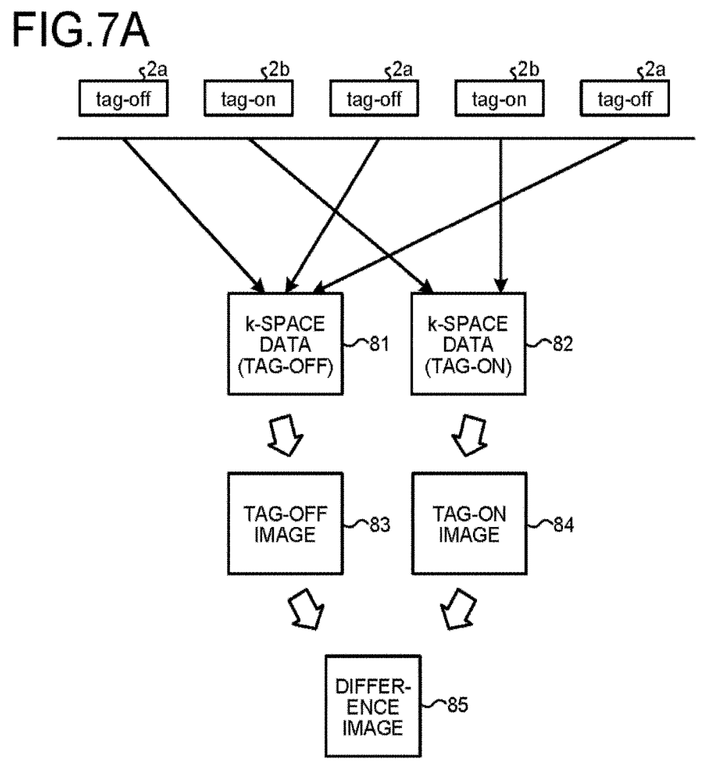
FIGS. 7A, 7B, and 7C illustrate an example of a pulse sequence executed by a magnetic resonance imaging apparatus according to a second embodiment.
Figure 7B:
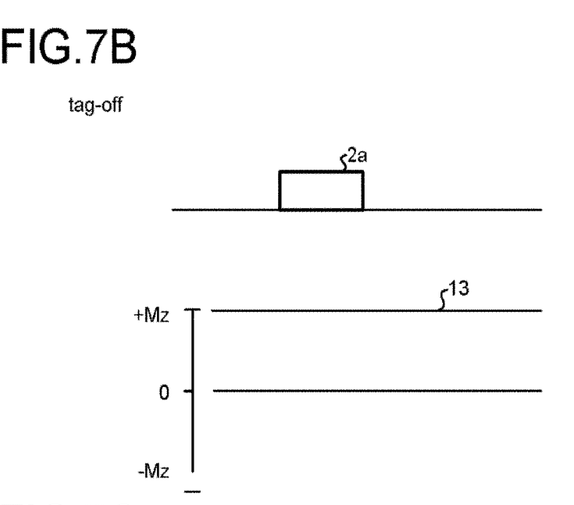

According to the tag-on/tag-off difference method, as indicated by FIG. 7A, the sequence controlling circuitry 120 executes a tag-on sequence realized as a first pulse sequence that involves the application of the pre-pulse 1 applied in a spatially-selective manner and a tag-off sequence realized as a second pulse sequence that does not involve the application of the pre-pulse 1 applied in the spatially-selective manner. The data acquisition 2b represents the data acquisition according to the tag-on sequence realized as the first pulse sequence that involves the application of the pre-pulse 1 applied in the spatially-selective manner. In contrast, the data acquisition 2a represents the data acquisition according to the tag-off sequence realized as the second pulse sequence that does not involve the application of the pre-pulse 1 applied in the spatially-selective manner.

In the present example, FIG. 7A illustrates an example in which the sequence controlling circuitry 120 alternately performs the data acquisition 2a according to the tag-off sequence and the data acquisition 2b according to the tag-on sequence. This method is called an alternate tag-on/tag-off difference method. For example, when an electrocardiography-synchronized image taking process is performed, by alternately executing the tag-off sequences and the tag-on sequences and calculating a difference between pieces of data of which the acquisition times are close to each other, it is possible to minimize errors that may be contained in the data.

FIG. 78 illustrates the data acquisition 2a according to the tag-off sequence. According to the tag-off sequence, the sequence controlling circuitry 120 does not apply the pre-pulse applied in the spatially-selective manner. The sequence controlling circuitry 120 executes the pulse sequence related to the data acquisition 2a by implementing an acquisition method based on the Stack of Stars method. In that situation, because no pre-pulse is applied, longitudinal magnetization 13 does not change.

Figure 7C:
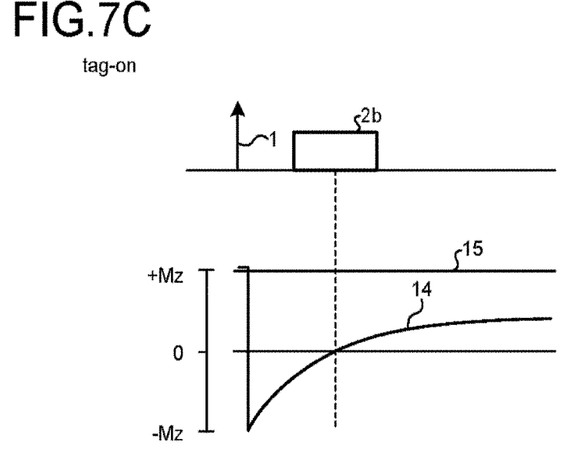

In contrast, FIG. 7C illustrates the data acquisition 2b according to the tag-on sequence. According to the tag-on sequence, the sequence controlling circuitry 120 applies the pre-pulse 1 applied in the spatially-selective manner. Longitudinal magnetization 14 in the region to which the pre-pulse 1 was applied is inverted from positive to negative due to the application of the pre-pulse 1 and is subsequently relaxed. In contrast, longitudinal magnetization 15 of the region to which the pre-pulse 1 was not applied does not change. The sequence controlling circuitry 120 executes the pulse sequence related to the data acquisition 2b at the time when the longitudinal magnetization 14 reaches a null point by implementing an acquisition method based on the Stack of Stars method.

Returning to the description of FIG. 7A, by employing the image generating function 136, the processing circuitry 150 generates k-space data 81 related to a tag-off image, from the data obtained on the basis of the data acquisition 2a. Further, by employing the image generating function 136, the processing circuitry 150 generates k-space data 82 related to a tag-on image from the data obtained on the basis of the data acquisition 2b. Further, by employing the image generating function 136, the processing circuitry 150 generates a tag-off image 83 by performing a Fourier transform on the k-space data 81 related to the tag-off image. Also, by employing the image generating function 136, the processing circuitry 150 generates a tag-on image 84 by performing a Fourier transform on the k-space data 82 related to the tag-on image. Further, by employing the image generating function 136, the processing circuitry 150 generates a difference image 85 by performing a difference calculating process between the tag-off image 83 and the tag-on image 84. As a result, it is possible to obtain an image from which the background signal contained in the tag-off image 83 has been eliminated.

Figure 8:
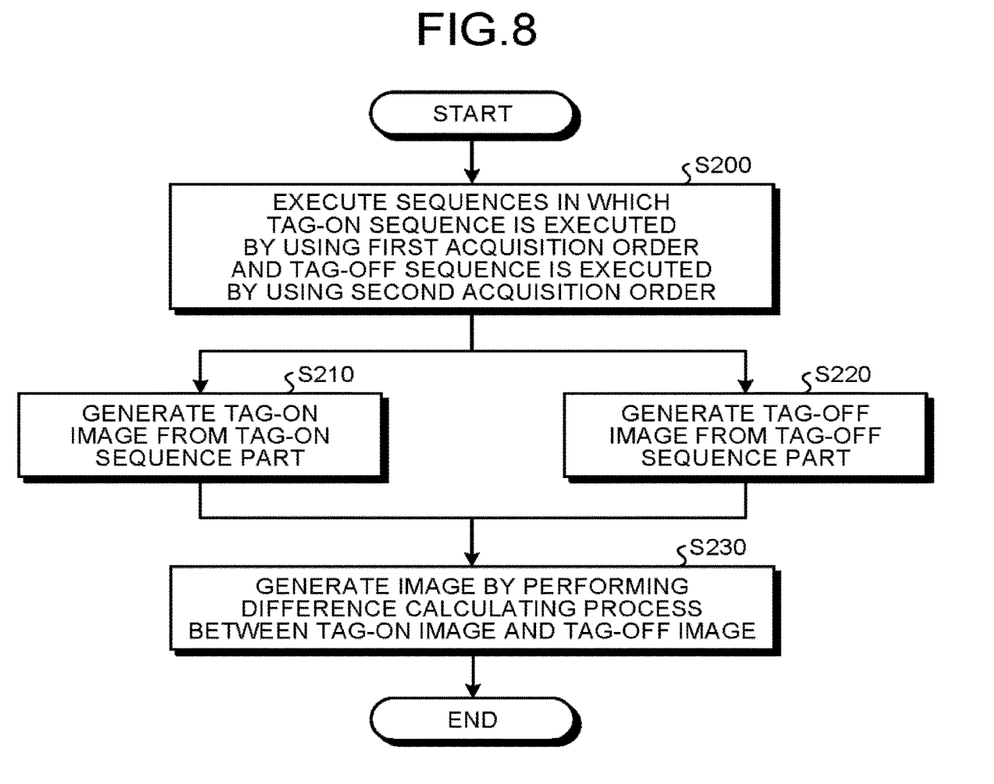
FIG. 8 is a flowchart illustrating a processing procedure performed by the magnetic resonance imaging apparatus according to the second embodiment.

A process performed by the magnetic resonance imaging apparatus 100 according to the second embodiment will be explained, with reference to the flowchart in FIG. 8. At step S200, the sequence controlling circuitry 120 executes a tag-on sequence and a tag-off sequence, while optimizing the acquisition order of the data acquisitions 2b in the tag-on sequence (the first sequence) to be executed and the acquisition order of the data acquisitions 2a in the tag-off sequence (the second sequence) to be executed.

In this situation, as explained in the first embodiment, possible sequences of acquisition order used for acquiring the three-dimensional k-space data while implementing the Stack of Stars method include: the first acquisition order by which the acquisitions are at first performed in the kz direction, and subsequently, the acquisitions are performed on the inside of the kx-ky plane; and the second acquisition order by which the acquisitions are at first performed on the inside of the kx-ky plane, and subsequently, the acquisitions are performed in the kz direction. In this situation, as explained in the first embodiment, the first acquisition order is an acquisition order by which it is possible to perform the acquisition related to the central part in the kz direction at the time when the longitudinal magnetization 12 reaches the null point 3. Thus, by using the first acquisition order, it is possible to improve the image quality. In contrast, in comparison to the first acquisition order, when the second acquisition order is used, a larger number of k-space lines can be acquired per pre-pulse. The second acquisition order is therefore able to keep small the number of segmented sections and to keep the image taking time period short. In other words, the first acquisition order has the advantage of being able to improve the image quality, but makes the image taking time period longer. In contrast, although the second acquisition order makes the image quality lower than that of the first acquisition order, the second acquisition order makes the image taking time period shorter.

In an embodiment, for the first pulse sequence (the tag-on sequence) involving the application f the pre-pulse applied in the spatially-selective manner, the first acquisition order is selected so as to prioritize the improvement of the image quality. In contrast, for the second pulse sequence (the tag-off sequence) that does rot involve the application of the pre-pulse applied in the spatially-selective manner, the second acquisition order, which is able to bring about a shorter image taking time period, is selected, because the data is basically related to the background signal and the image quality thereof is not so important as that with the tag-on sequence. With these arrangements, it is possible to maintain the image quality while keeping the image taking time period short.

Accordingly, in the magnetic resonance imaging apparatus 100 according to the second embodiment, the sequence controlling circuitry 120 executes the sequences by executing the tag-on sequence while using the first acquisition order and executing the tag-off sequence while using the second acquisition order (step S200). In other words, in the first pulse sequence, the sequence controlling circuitry 120 performs the three-dimensional acquisitions by performing the data acquisition 2b while using the first acquisition order by which the acquisitions are at first performed in the kz direction and subsequently the acquisitions are performed on the inside of the kx-ky plane. In contrast, in the second pulse sequence, the sequence controlling circuitry 120 performs the three-dimensional acquisitions by performing the data acquisition 2a while using the second acquisition order by which the acquisitions are at first performed on the inside of the kx-ky plane and subsequently the acquisitions are performed in the kz direction.

After that, by employing the image generating function 136, the processing circuitry 150 generates the tag-on image 84 from the tag-on sequence part within the sequences executed at step S200 (step S210). More specifically, by employing the image generating function 136, the processing circuitry 150 generates the k-space data 82 related to the tag-on image from the sequence executed at step S200 and further generates the tag-on image 84 by performing a Fourier transform on the k-space data 82 related to the tag-on image.

Further, by employing the image generating function 136, the processing circuitry 150 generates the tag-off image 83 from the tag-off sequence part within the sequences executed at step S200 (step S220). More specifically, by employing the image generating function 136, the processing circuitry 150 generates the k-space data 81 related to the tag-off image from the sequence executed at step S200 and further generates the tag-off image 83 by performing a Fourier transform on the k-space data 81 related to the tag-off image.

Subsequently, by employing the image generating function 136, the processing circuitry 150 generates the difference image 85 by performing a difference calculating process between the tag-on image 84 generated at step S210 and the tag-off image 83 generated at step S220.

As explained above, by using the magnetic resonance imaging apparatus 100 according to the second embodiment, it is possible to improve the image quality while keeping the image taking time period short.

Possible embodiments are not limited to the examples above.

In the above embodiment, the example is explained in which, for the first pulse sequence (the tag-on sequence), the sequence controlling circuitry 120 applies the pre-pulse 1 applied in the spatially-selective manner; and for the second pulse sequence (the tag-off sequence), the sequence controlling circuitry 120 applies no pre-pulse. However, possible embodiments are not limited to this example. For instance, another arrangement is acceptable in which, for the first pulse sequence, the sequence controlling circuitry 120 applies a pre-pulse applied in a spatially non-selective manner and another pre-pulse applied in a spatially-selective manner; and for the second pulse sequence, the sequence controlling circuitry 120 applies a pre-pulse applied in a spatially non-selective manner. Subsequently, in that situation, by employing the image generating function 130, the processing circuitry 150 generates a difference image by performing a difference calculating process between the image obtained from the first pulse sequence and the image obtained from the second pulse sequence.

Further, the example was explained in which the sequence controlling circuitry 120 alternately executes the tag-on sequences and the tag-off sequences in an interweaved manner; however, possible embodiments are not limited to this example. Another arrangement is also acceptable in which, for instance, the sequence controlling circuitry 120 at first executes all the tag-on sequences and, after the execution of all the tag-on sequences is completed, executes the tag-off sequences.

Third Embodiment

In a third embodiment, an example will be explained in which the processing circuitry 150 determines which acquisition order is to be used for performing three-dimensional acquisitions by implementing the Stack of Stars method, by selecting one from between the first acquisition order and the second acquisition order, so that the sequence controlling circuitry 120 performs the three-dimensional acquisitions by using the determined acquisition order.

At first, by employing the controlling function 133, the processing circuitry 150 determines which acquisition order is to be used by the sequence controlling circuitry for performing the three-dimensional acquisitions, by selecting one from between the first acquisition order by which the acquisitions are performed on the inside of the kx-ky plane and the second acquisition order by which the acquisitions are at first performed on the inside of the kx-ky plane and subsequently the acquisitions are performed in the kz direction.

In a first example, by employing the controlling function 133, the processing circuitry 150 determines which one of the first and the second acquisition orders is to be used by the sequence controlling circuitry 120 for performing the three-dimensional acquisitions, on the basis of the time period from the time when the pre-pulse 1 is applied to the time when the longitudinal magnetization reaches the null point 3. For example, when the time period from the time when the pre-pulse 1 is applied to the time when the longitudinal magnetization reaches the null point 3 is short, the timing with which the data acquisitions should be performed is more restricted than in the situation where the time period until the longitudinal magnetization reaches the null point 3 is long. Accordingly, it is desirable to perform the acquisitions by using the first acquisition order that makes it possible to more precisely control the timing of the data acquisition performed near the center in the kz direction. In that situation, by employing the controlling function 133, the processing circuitry 150 determines that the acquisitions are to be performed by using the first acquisition order, for example, when the time period from the time when the pre-pulse 1 is applied to the time when the longitudinal magnetization reaches the null point 3 is shorter than a predetermined threshold value and determines that the acquisitions are to be performed by using the second acquisition order when the time period is equal to or longer than the prescribed threshold value. In another example, for instance, when the time period from the time when the pre-pulse 1 is applied to the time when the longitudinal magnetization reaches the null point 3 is long, because the image taking time period becomes longer as a whole, it is more strongly desired to shorten the image taking time period. Accordingly, it is desirable to shorten the image taking time period by performing the acquisitions by using the second acquisition order. In that situation also, by employing the controlling function 133, the processing circuitry 150 determines that the acquisitions are to be performed by using the first acquisition order, for example, when the time period from the time when the pre-pulse 1 is applied to the time when the longitudinal magnetization reaches the null point 3 is shorter than the prescribed threshold value and determines that the acquisitions are to be performed by using the second acquisition order when the time period is equal to or longer than the prescribed threshold value.

In a second example, by employing the controlling function 133, the processing circuitry 150 determines which one of the first and the second acquisition orders is to be used by the sequence controlling circuitry 120 for performing the three-dimensional acquisitions on the basis of a site to be imaged. Because the image quality to be required and the image taking time period to be required vary among various sites to be imaged, the processing circuitry 150 and the controlling function 133 determine which one of the first and the second acquisition orders is to be used by the sequence controlling circuitry 120 for performing the three-dimensional acquisitions by taking the image quality and the image taking time period into consideration on the basis of the site in a part to be imaged.

In a third example, by employing the controlling function 133, the processing circuitry 150 determines which one of the first and the second acquisition orders is to be used by the sequence controlling circuitry 120 for performing the three-dimensional acquisitions, in accordance with the size of a region of interest. For example, by employing the controlling function 133, the processing circuitry 150 determines which one of the first and the second acquisition orders is to be used by the sequence controlling circuitry 120 for performing the three-dimensional acquisitions, in accordance with the number of slices. Alternatively, by employing the controlling function 133, the processing circuitry 150 may determine which one of the acquisition orders is to be used in accordance with any of other image taking conditions.

In a fourth example, by employing the controlling function 133, the processing circuitry 150 determines which one of the first and the second acquisition orders is to be used by the sequence controlling circuitry 120 for performing the three-dimensional acquisitions, on the basis of an input received from a user.

By employing the controlling function 133, when the processing circuitry 150 has determined which one of the first and the second acquisition orders is to be used by the sequence controlling circuitry 120 for performing the three-dimensional acquisitions, the sequence controlling circuitry 120 performs the three-dimensional acquisitions by implementing the Stack of Stars method, while using the acquisition order determined by the controlling function 133.

As explained above, according to the third embodiment, the processing circuitry 150 is configured to determine the optimal acquisition order. Accordingly, the sequence controlling circuitry 120 is able to optimize the pulse sequences in accordance with the purpose of each image taking process.

As explained above, by using the magnetic resonance imaging apparatus according to at least one aspect of the embodiments, it is possible to improve the image quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
sequence controlling circuitry configured to apply a pre-pulse that inverts longitudinal magnetization from a positive value to a negative value and configured, when a predetermined time period has elapsed, to acquire k-space data by performing three-dimensional acquisitions in which a radial acquisition is performed on a kx-ky plane, and a Cartesian acquisition is performed in a kz direction, wherein the sequence controlling circuitry performs the three-dimensional acquisitions by using a first acquisition order by which an acquisition is at first performed in the kz direction and subsequently the acquisition is performed on an inside of the kx-ky plane.

2. The magnetic resonance imaging apparatus according to claim 1, wherein
the sequence controlling circuitry executes a first pulse sequence that involves application of the pre-pulse applied in a spatially-selective manner and a second pulse sequence that involves no application of the pre-pulse applied in the spatially-selective manner, and in the first pulse sequence, the sequence controlling circuitry performs the three-dimensional acquisitions by using the first acquisition order.

3. The magnetic resonance imaging apparatus according to claim 2, wherein, in the second pulse sequence, the sequence controlling circuitry performs the three-dimensional acquisitions by using a second acquisition order by which an acquisition is at first performed on the inside of the kx-ky plane and subsequently the acquisition is performed in the kz direction.

4. The magnetic resonance imaging apparatus according to claim 2, wherein in the first pulse sequence, the sequence controlling circuitry applies the pre-pulse applied in a spatially non-selective manner and the pre-pulse applied in a spatially-selective manner, and in the second pulse sequence, the sequence controlling circuitry applies the pre-pulse applied in a spatially non-selective manner.

5. The magnetic resonance imaging apparatus according to claim 1, wherein the sequence controlling circuitry configured to acquire the k-space data by performing three-dimensional acquisitions comprises sequence controlling circuitry configured to acquire k-space data by executing a Fast Spin Echo (FSE) method.

6. The magnetic resonance imaging apparatus according to claim 1, wherein the sequence controlling circuitry configured to acquire the k-space data by performing three-dimensional acquisitions comprises sequence controlling circuitry configured to acquire k-space data by executing a balanced Steady State Free Precession (bSSFP) method.

7. A magnetic resonance imaging apparatus comprising:
sequence controlling circuitry configured to apply a pre-pulse that inverts longitudinal magnetization from a positive value to a negative value and configured, when a predetermined time period has elapsed, to acquire k-space data by performing three-dimensional acquisitions in which a radial acquisition is performed on a kx-ky plane, and a Cartesian acquisition is performed in a kz direction, wherein the sequence controlling circuitry performs an acquisition related to a central part in the kz direction at a time when the longitudinal magnetization reaches a null point.

8. The magnetic resonance imaging apparatus according to claim 7, wherein the sequence controlling circuitry configured to acquire the k-space data by performing three-dimensional acquisitions comprises sequence controlling circuitry configured to acquire k-space data by executing a Fast Spin Echo (FSE) method.

9. The magnetic resonance imaging apparatus according to claim 7, wherein the sequence controlling circuitry configured to acquire the k-space data by performing three-dimensional acquisitions comprises sequence controlling circuitry configured to acquire k-space data by executing a balanced Steady State Free Precession (bSSFP) method.

10. A magnetic resonance imaging apparatus comprising:
sequence controlling circuitry configured to apply a pre-pulse that inverts longitudinal magnetization from a positive value to a negative value and configured, when a predetermined time period has elapsed, to acquire k-space data by performing three-dimensional acquisitions in which a radial acquisition is performed on a kx-ky plane, and a Cartesian acquisition is performed in a kz direction; and processing circuitry configured to determine which acquisition order is to be used by the sequence controlling circuitry for performing the three-dimensional acquisitions, by selecting one from between: a first acquisition order by which an acquisition is at first performed in the kz direction and subsequently the acquisition is performed on an inside of the kx-ky plane; and a second acquisition order by which an acquisition is at first performed on the inside of the kx-ky plane and subsequently the acquisition is performed in the kz direction, wherein the sequence controlling circuitry performs the three-dimensional acquisitions by using the acquisition order determined by the processing circuitry.

11. The magnetic resonance imaging apparatus according to claim 10, wherein on a basis of a time period from a time when the pre-pulse is applied to a time when the longitudinal magnetization reaches a null point, the processing circuitry determines which one of the first and the second acquisition orders is to be used by the sequence controlling circuitry for performing the three-dimensional acquisitions.

12. The magnetic resonance imaging apparatus according to claim 10, wherein, in accordance with a site to be imaged, the processing circuitry determines which one of the first and the second acquisition orders is to be used by the sequence controlling circuitry for performing the three-dimensional acquisitions.

13. The magnetic resonance imaging apparatus according to claim 10, wherein, in accordance with a size of a region of interest, the processing circuitry dete lines which one of the first and the second acquisition orders is to be used by the sequence controlling circuitry for performing the three-dimensional acquisitions.

14. The magnetic resonance imaging apparatus according to claim 10, wherein the sequence controlling circuitry configured to acquire the k-space data by performing three-dimensional acquisitions comprises sequence controlling circuitry configured to acquire k-space data by executing a Fast Spin Echo (FSE) method.

15. The magnetic resonance imaging apparatus according to claim 10, wherein the sequence controlling circuitry configured to acquire the k-space data by performing three-dimensional acquisitions comprises sequence controlling circuitry configured to acquire k-space data by executing a balanced Steady State Free Precession (bSSFP) method.

* * * * *